US006307220B1

(12) United States Patent
Yamazaki

(10) Patent No.: US 6,307,220 B1
(45) Date of Patent: *Oct. 23, 2001

(54) SEMICONDUCTOR DEVICE

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/129,669

(22) Filed: Aug. 5, 1998

(30) Foreign Application Priority Data

Aug. 5, 1997 (JP) .................................................. 9-223040

(51) Int. Cl.$^7$ ................................................ H01L 31/072
(52) U.S. Cl. ........................ 257/192; 257/289; 257/327
(58) Field of Search ............................... 257/19, 20, 192, 257/289, 327, 344, 408

(56) References Cited

U.S. PATENT DOCUMENTS

| 4,549,336 | | 10/1985 | Sheppard Douglas P. . |
| 4,582,395 | * | 4/1986 | Morozumi ............................... 257/59 |
| 4,710,788 | | 12/1987 | Dambkes et al. . |
| 5,210,437 | | 5/1993 | Sawada et al. . |
| 5,272,365 | | 12/1993 | Nakagawa . |
| 5,324,960 | | 6/1994 | Pfiester et al. . |
| 5,461,250 | * | 10/1995 | Burghartz et al. ..................... 257/192 |
| 5,786,618 | | 7/1998 | Wen . |
| 5,792,679 | * | 8/1998 | Nakato ................................. 438/407 |
| 5,859,443 | | 1/1999 | Yamazaki et al. . |
| 5,905,291 | | 5/1999 | Utsunomiya et al. . |
| 5,952,699 | | 9/1999 | Yamazaki et al. . |
| 6,107,654 | * | 8/2000 | Yamazaki ............................... 257/194 |

* cited by examiner

Primary Examiner—Sara Crane
(74) Attorney, Agent, or Firm—Fish & Richardson P.C.

(57) ABSTRACT

To provide a semiconductor device having a new structure capable of simultaneously realizing high operational function and high reliability, in an activation region 102 sandwiched by a source region 101 and a drain region 103 constituted by a crystalline semiconductor, $Si_xGe_{1-x}$ regions 105 are formed by locally adding germanium and a depletion layer widening from the drain side toward the source side is effectively restrained by utilizing a difference in band structures of the $Si_xGe_{1-x}$ regions 105 and Si regions 106 where germanium is not added.

75 Claims, 7 Drawing Sheets

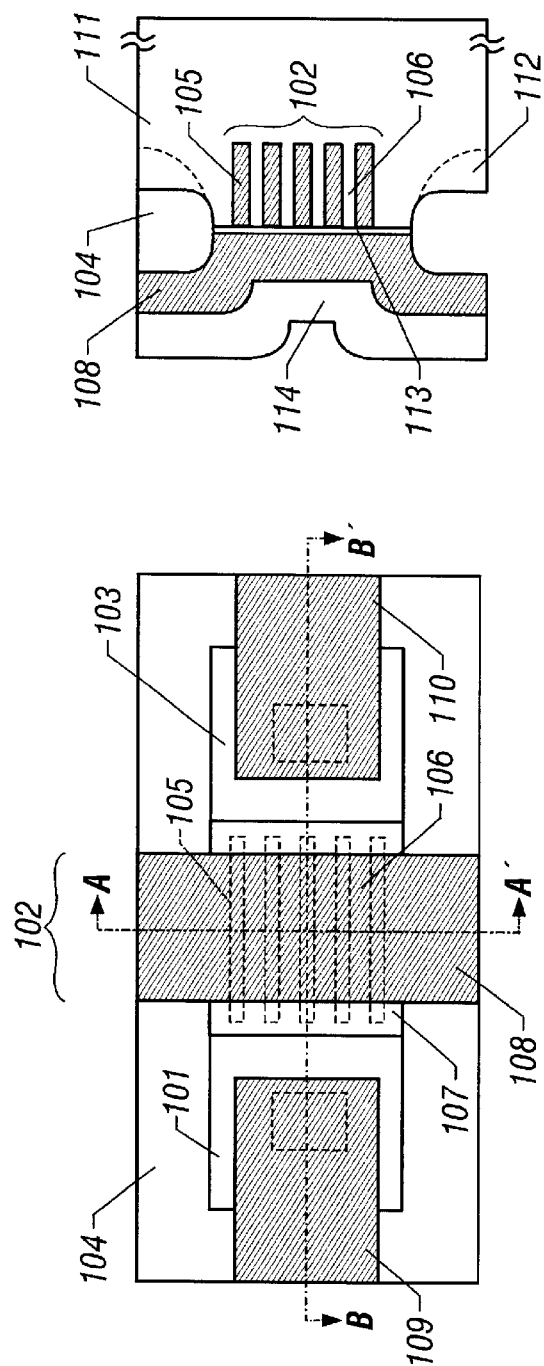
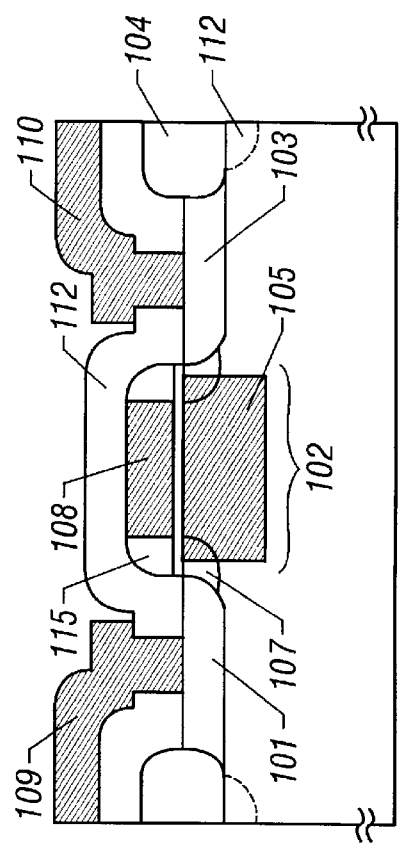
FIG. 1A
FIG. 1B
FIG. 1C

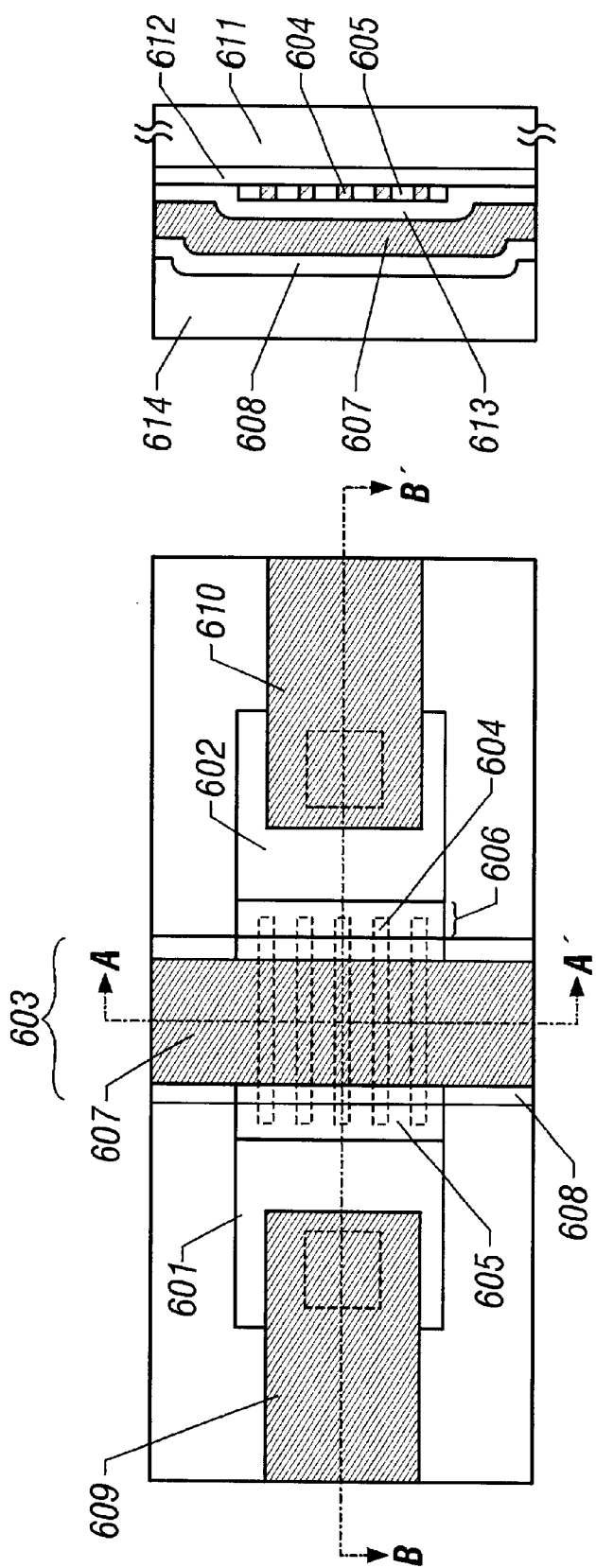
FIG. 6B
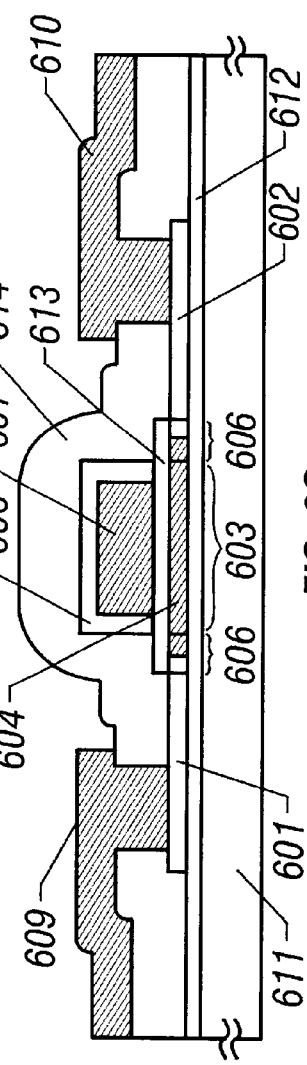
FIG. 6A
FIG. 6C

SEMICONDUCTOR DEVICE

BACKGROUND OF THE INVENTION

1. Field of the Invention

The present invention disclosed in the specification relates to a semiconductor device utilizing crystalline semiconductor, particularly to the constitution of an insulating gate type transistor. Further, the present invention relates to the constitution of a semiconductor circuit and an electrooptical device comprising such a transistor or the like and an electronic instrument compounded with these.

Further, in the specification, all of a transistor, a semiconductor circuit, an electrooptical device and an electronic instrument are dealt with by including them in the category of "semiconductor device". That is, all of devices capable of functioning by utilizing properties of a semiconductor are referred to as semiconductor devices. Accordingly, semiconductor devices described in the scope of claims include not only a single body of a transistor or the like but a semiconductor circuit and an electrooptical device integrated with these and an electronic instrument.

2. Description of Related Art

In the current state of VLSI (Very Large Scale Integrated Circuit) and ULSI (Ultra Large Scale Integrated Circuit), the element size tends to be more and more miniaturized in pursuit of promoting a further degree of integration. The trend is observed similarly in MOSFET (Metal Oxide Semiconductor Field Effect Transistor) using a bulk single crystal and TFT (Thin Film Transistor) using a thin film. Currently, there has been requested an element having a channel length of 1 $\mu$m or less, further, 0.2 $\mu$m or less.

However, there has been known a phenomenon referred to as short channel effect as a factor for hampering miniaturization. The short channel effect gives rise to various problems of lowering of source/drain withstand voltage, lowering of threshold voltage and the like which are caused with a decrease in the channel length (refer to "Submicron Device I"; Mitsumasa Koyanagi et al., pp. 88–138, Maruzen Co., Ltd., 1987).

According to the reference, there has mostly known a punch through phenomenon as one of causes of the decrease in withstand voltage. According to the phenomenon, with a decrease in the channel length, potential influence of a depletion layer on the side of a drain effects on the side of a source and the diffusion potential on the side of the source is lowered (barrier lowering phenomenon induced by drain) by which there is brought about a situation in which control of majority carriers by the gate voltage becomes difficult.

Such a short channel effect poses a problem which must be overcome in carrying out miniaturization. Further, as a representative example of short channel effect, lowering of the threshold voltage is pointed out. This seems to be caused by widening of the depletion layer.

Although various countermeasures have been performed in respect of the short channel effect mentioned above, a countermeasure which is mostly carried out generally is channel dope. The channel dope is a technology for restraining the short channel effect by adding a very small amount of impurity elements such as P (phosphorus) or B (boron) over an entire channel forming region (Japanese Unexamined Patent Publication No. JP-A-4-206971, Japanese Unexamined Patent Publication No. JP-A-4-286339 and so on).

The channel dope is performed with a purpose of controlling the threshold voltage and restraining the punch through phenomenon. However, the channel dope technology is provided with a drawback of imposing serious restriction on the field effect mobility (hereinafter, referred to as mobility) of TFT. That is, movement of carriers is hampered by impurity elements which are added intentionally and the carrier mobility is significantly deteriorated.

SUMMARY OF THE INVENTION

The present invention has been carried out in view of the above-described problems and it is an object of the present invention to provide a semiconductor device having a totally new structure capable of simultaneously realizing high operational function (high mobility) and high reliability (high withstand voltage characteristic) and its fabrication method.

According to an aspect of the present invention, there is provided a semiconductor device including a source region, a drain region and an activation region formed by utilizing a crystalline semiconductor wherein the activation region comprises $Si_xGe_{1-x}$ (0<x<1) regions formed by locally adding germanium and Si regions where germanium is not added, and a depletion layer widening from the drain region toward the source region is restrained by the $Si_xGe_{1-x}$ (0<x<1) regions locally provided.

According to another aspect of the present invention, there is provided a semiconductor device including a source region, a drain region and an activation region formed by utilizing a crystalline semiconductor wherein the activation region comprises $Si_xGe_{1-x}$ (0<x<1) regions formed by locally adding germanium and Si regions where germanium is not added, and a depletion layer widening from the drain region toward the source region is restrained by the Si regions locally provided.

According to another aspect of the present invention, there is provided a semiconductor device including a source region, a drain region and an activation region formed by utilizing a crystalline semiconductor wherein the activation region comprises $Si_xGe_{1-x}$ (0<x<1) regions formed by locally adding germanium and Si regions where germanium is not added, and a depletion layer widening from the drain region toward the source region is restrained and a threshold value voltage is controlled by the $Si_xGe_{1-x}$ (0<x<1) regions locally provided.

According to another aspect of the present invention, there is provided a semiconductor device including a source region, a drain region and an activation region formed by utilizing a crystalline semiconductor wherein the activation region comprises $Si_xGe_{1-x}$ (0<x<1) regions formed by locally adding germanium and Si regions where germanium is not added, and a depletion layer widening from the drain region toward the source region is restrained and a threshold value voltage is controlled by the Si regions locally provided.

The gist of the present invention resides in that two kinds of regions having different band structure are intentionally formed by locally adding germanium to the activation region and the depletion layer widening from the drain side toward the source side is restrained by utilizing a difference between the band structures. Incidentally, the activation region is referred to as a region sandwiched between the source and the drain region (or between LDD regions)

Further, the inventors define a technical term of "pinning" with a meaning of "restraining" since the effect of restraining the depletion layer is achieved as if the depletion layer were pinned. Further, the semiconductor device utilizing the present invention is referred to as "pinning FET" (or pinning TFT) and is clearly differentiated from the conventional semiconductor device.

The semiconductor device according to the present invention comprising the above-described constitution realizes simultaneously high operational function and high reliability. An explanation will be given of details in respect of the semiconductor device according to the present invention by embodiments shown below.

BRIEF DESCRIPTION OF THE DRAWINGS

FIGS. 1A, 1B and 1C are views showing the constitution of a semiconductor device according to the present invention;

FIGS. 6A, 6B and 6C are views showing the constitution of a semiconductor device according to the present invention;

Figure 2:
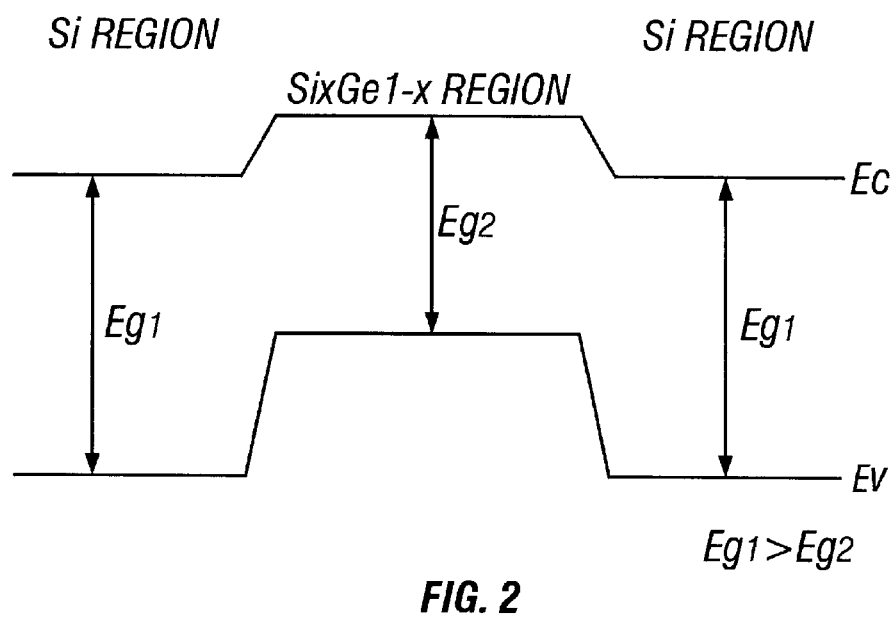
FIG. 2 is a diagram showing a band structure of an activation region.

DETAILED DESCRIPTION OF PREFERRED EMBODIMENTS (Embodiment 1)

An explanation will be given of the structure of a pinning FET in reference to FIGS. 1A, 1B and 1C. FIG. 1A is a top view, FIG. 1B is a sectional view taken along a line A–A' of the top view and FIG. 10 is a sectional view taken along a line B–B' of the top view.

In FIG. 1A, numeral 101 designates a source region, numeral 102 designates an activation region, numeral 103 designates a drain region and numeral 104 designates a field oxide film. Further, a plurality of regions 105 provided to cross the activation region 102 are regions locally added with germanium (Ge) (hereinafter, abbreviated as a region of $Si_xGe_{1-x}$ (0<x<1).

Incidentally, a relationship of 0<x<1 is established in respect of the composition designated by $Si_xGe_{1-x}$. That is, the $Si_xGe_{1-x}$ region 105 is not provided with a composition of only Si or only Ge.

Further, in the activation region 102, a region 106 which is not added with germanium is a region comprising silicon which is intrinsic or substantially intrinsic (hereinafter, abbreviated as a Si region).

Further, LDD (Lightly Doped Drain) regions 107 are provided at both ends of the activation region 102 and a gate electrode 108 is provided above the activation region 102 via a gate insulating film. Silicon provided with a conductivity is used for the gate electrode 108. Otherwise, a material whose major component is aluminum, tantalum, tungsten, molybdenum or the like may be used. Further, there are provided via an interlayer insulating film, a source electrode 109 and a drain electrode 110 which are respectively brought into contact with the source region 101 and the drain region 103.

At this point, an explanation will be given of the $Si_xGe_{1-x}$ region and the Si region which are the characteristics of the present invention. As mentioned above, according to the present invention, the activation region 102 is constituted by the $Si_xGe_{1-x}$ regions 105 and the Si regions 106. FIG. 1A shows the most typical constitution of the activation region 102. The constitution is that the $Si_xGe_{1-x}$ regions 105 and the Si regions 106 are arranged substantially in parallel with each other and alternately. Further, according to such a constitution, the activation region 102 can be regarded to be divided into a plurality of the Si regions 106 by the $Si_xGe_{1-x}$ regions 105.

The $Si_xGe_{1-x}$ region 105 can be formed by adding germanium by using a mass-separated ion implantation process. An explanation will be given here of a change in a band gap in the case of adding germanium in reference to FIG. 2.

An energy band diagram shown by FIG. 2 schematically indicates a change in band structures of the $Si_xGe_{1-x}$ region and the Si region contiguous to each other. Although a band structure at an interface of the $Si/Si_xGe_{1-x}$ is yet in a stage of research, there has been a report in which the band structure as shown by FIG. 2 is produced when a $Si_xGe_{1-x}$ layer is sandwiched by Si layers ("Silicon Group Hetero Device", Seijiro Furukawa et al., pp. 190, Maruzen Co., Ltd., 1991).

Although the report is concerning a content with regard to a laminated layer structure, since the structure shown by FIGS. 1A, 1B and 1C is a structure where a $Si_xGe_{1-x}$ layer is sandwiched by Si layers and therefore, as shown by the schematic diagram of FIG. 2, a band gap (Eg2) of the $Si_xGe_{1-x}$ region is smaller than a band gap (Eg1) of the Si region. Further, it is anticipated that the valence band and the conduction band of the $Si_xGe_{1-x}$ region are above those of the Si region.

In this case, the band gap of the $Si_xGe_{1-x}$ region is varied by an amount of germanium included in the composition. According to the present invention, x is made to vary such that 0<x<1, preferably 0.05<x<0.95 (representatively, 0.5<x<0.95) in the composition designated by $Si_xGe_{1-x}$. Further, the band gap (Eg2) of the $Si_xGe_{1-x}$ region is varied by the control in a range of 0.66<Eg2<1.6 (representatively, 0.66<Eg2<1.1).

In this case, a potential barrier is formed between the $Si_xGe_{1-x}$ region and the Si region. It seems that the barrier behaves as a barrier for hampering movement from the Si region to the $Si_xGe_{1-x}$ region for electron. That is, electron moves preferentially in the Si region in the case of operating an N-channel type where the majority carrier is electron.

Conversely, it seems that the barrier behaves as a barrier for hampering movement from the $Si_xGe_{1-x}$ region to the Si region for hole. That is, hole preferentially moves in the $Si_xGe_{1-x}$ region in the case of operating a P-channel type where the majority carrier is hole.

Figure 3:
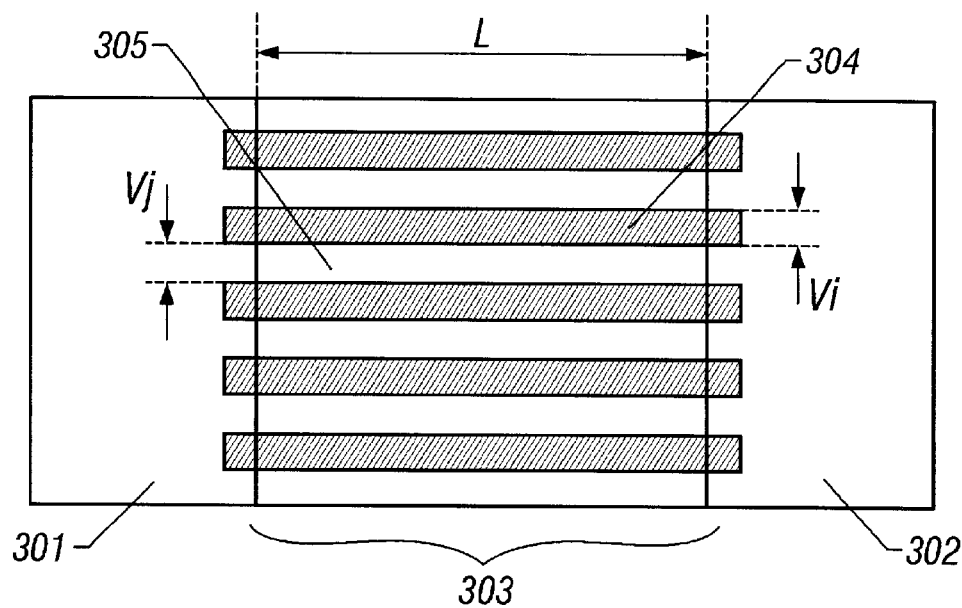
FIG. 3 is a view indicating the definition of a channel length and a channel width.

Here, the channel length and the channel width are defined in reference to FIG. 3. In FIG. 3, a distance between a source region 301 and a drain region 302 (in correspondence with a length of an activation region 303) is defined as a channel length (L). The present invention is effective when the length is 2 μm or less, typically, 30~500 nm (further preferably, 50~200 nm). Further, a direction along the channel length is referred to as a channel length direction.

Further, the width of an arbitrary $Si_xGe_{1-x}$ region 304 is designated by notation vi. The length vi is preferably set to 2 μm or less, preferably 50~300 nm (further preferably, 1~50 nm). Further, when a sum of widths of all of the $Si_xGe_{1-x}$ regions present in the activation region 303, is designated by notation Vi, the sum is defined by the following equation.

$$V_i = \sum_{i=1}^{m} v_i \quad (1)$$

Further, when an N-channel type FET is fabricated, the $Si_xGe_{1-x}$ region 304 functions as a region for pinning a depletion layer (hereinafter, abbreviated as pinning region). Therefore, to achieve the pinning effect of the present invention, at least one of the $Si_xGe_{1-x}$ regions needs to provide in respect of the activation region 303. That is, i=1~m and 1 through m of the $Si_xGe_{1-x}$ regions need to form.

Further, the width of a Si region 305 is designated by vj. The width vj is preferably set to 2 μm or less, preferably, 50~300 nm (further preferably, 1~50 nm) similar to that of the $Si_xGe_{1-x}$ region 304. Further, when a sum of the widths vj of the Si regions 305 is designated by notation Vj, the sum is defined by the following equation.

$$V_j = \sum_{j=1}^{n} v_j \quad (2)$$

Further, when a P-channel type FET is fabricated, the Si region 305 functions as a region for pinning the depletion layer. That is, to provide the pinning effect of the present invention, at least one of the Si regions needs to provide in respect of the activation region 303. That is, j=1~n and 1 through n of the Si regions need to form.

Further, in an N-channel type FET, the $Si_xGe_{1-x}$ region 304 functions as a pinning region and the Si region 305 functions as a region for moving carrier (channel forming region). Accordingly, in the case of an N-channel type FET, the sum Vj of widths of the Si regions is defined as the channel width. Conversely, in the case of a P-channel type FET, carrier moves in the $Si_xGe_{1-x}$ region and accordingly, the sum Vi of the widths of the $Si_xGe_{1-x}$ regions constitutes the channel width.

It is a significant characteristic of the present invention that the roles of the pinning region and the channel forming region are reversed depending on an N-channel type FET and a P-channel type FET.

The channel width mentioned above corresponds to the width of the activation region 303 (length in a direction orthogonal to the direction of the channel length of the activation region). Further, a direction along the channel width is referred to as a channel width direction.

According to the semiconductor device of the present invention defined as described above, the device is considered to apply to a semiconductor device particularly having an extremely small channel length and therefore, formation of the $Si_xGe_{1-x}$ must be performed with extremely fine dimensions.

Accordingly, in forming the $Si_xGe_{1-x}$ region 105 in FIG. 1A, extremely fine photolithography technology and ion implantation technology are needed. That is, a fine pattern mentioned above cannot be formed without freely using fine exposure technology using excimer laser, electron beam, focused ion beam or the like.

Further, naturally, it is preferable for finely controlling an amount of introducing germanium to utilize a technology capable of finely controlling concentration such as ion implantation technology or the like. Naturally, an ion doping process (plasma doping process or the like) where mass separation is not performed may be used.

Next, an explanation will be given of FIG. 1B. Incidentally, an explanation will be given of FIG. 1B by using the same notations in respect of portions explained in reference to FIG. 1A.

In FIG. 1B, numeral 111 designates a single crystal silicon substrate and an N-type or a P-type silicon substrate is used. Further, as the silicon substrate 111, all of silicon substrates formed by normal CZ (Czochralski) method, FZ (Floating Zone Melting) method or other methods can be used. However, in order to promote the mobility of carrier, it is preferable to use a high resistance silicon substrate having a small dopant amount (concentration of adding impurity elements).

Further, numeral 112 designates a channel stopper formed under the field oxide film 104, numeral 113 designates a gate insulating film and numeral 114 designates an interlayer insulating film. Further, at inside of the activation region 102, regions other than the $Si_xGe_{1-x}$ regions 105 constitute the Si regions 106.

Further, the $Si_xGe_{1-x}$ regions 105 are formed in the activation region 102 in a stripe shape. The $Si_xGe_{1-x}$ region 105 is preferably formed deeply such that the depletion layer widening from the drain side toward the source side is effectively pinned. Basically, it is preferable that the depth of the $Si_xGe_{1-x}$ 105 is deeper than the junction depth of the source/drain regions.

Next, an explanation will be given of FIG. 1C. In FIG. 1C, the regions 107 provided at inner sides of the source region 101 and the drain region 103 constitute the LDD regions. The LDD region 107 is formed by utilizing a side wall 115.

Further, when the $Si_xGe_{1-x}$ region 105 is formed to invade the inner portion of the LDD region 107 as shown by FIG. 1C, the pinning effect in respect of the depletion layer on the side of the drain is intensified which is effective. Naturally, it is further effective to form the $Si_xGe_{1-x}$ region 105 to invade the inner portion of the drain region 103. Further, the $Si_xGe_{1-x}$ region 105 may naturally be formed to invade both of the source region 101 and the drain region 103 (over the source region 101 and the drain region 103).

The pinning FET of the present invention is basically provided with the constitution described above. However, the constitution of the activation region is the most important and in respect of a structure of the element which is not directly related to the activation region, it is not limited to the structure shown by FIGS. 1A, 1B and 1C.

Next, an explanation will be given of the roles achieved by the $Si_xGe_{1-x}$ region 105 and the Si region 106 and effects achieved thereby with an example of an N-channel type FET.

First, an explanation will be given of a first effect. The most significant object of the present invention resides in restraining (pinning) the depletion layer widening from the drain side to the source side to thereby prevent lowering in the potential barrier on the side of the source caused by the drain voltage. Further, lowering of the threshold voltage and lowering of the withstand voltage by punch through can efficiently be prevented by restraining the widening of the depletion layer.

In FIGS. 1A, 1B and 1C, the $Si_xGe_{1-x}$ regions 105 locally formed in the activation region 102 operate as a potential stopper (barrier) against the depletion layer widening from the drain side and effectively restrains the widening of the depletion layer. Accordingly, the diffusion potential on the side of the source is not pulled down by the widening of the depletion layer and the punch through phenomenon is prevented. Further, an increase in electric charge in the depletion layer caused by widening of the depletion layer is restrained and accordingly, lowering of the threshold voltage can be avoided.

As mentioned above, by forming the $Si_xGe_{1-x}$ regions 105, the short channel effect which has been the very serious problem in miniaturizing the element can be restrained or prevented. This effect is the most important effect of the semiconductor device according to the present invention.

Next, an explanation will be given of a second effect. According to an N-channel type FET of the present invention, narrow channel effect can intentionally be intensified by the $Si_xGe_{1-x}$ region 105. The narrow channel effect is a phenomenon observed when the channel width is extremely narrow which results in an increase in the threshold value voltage (details are shown in "Submicron Device I" referred to in conventional example).

Figure 4:
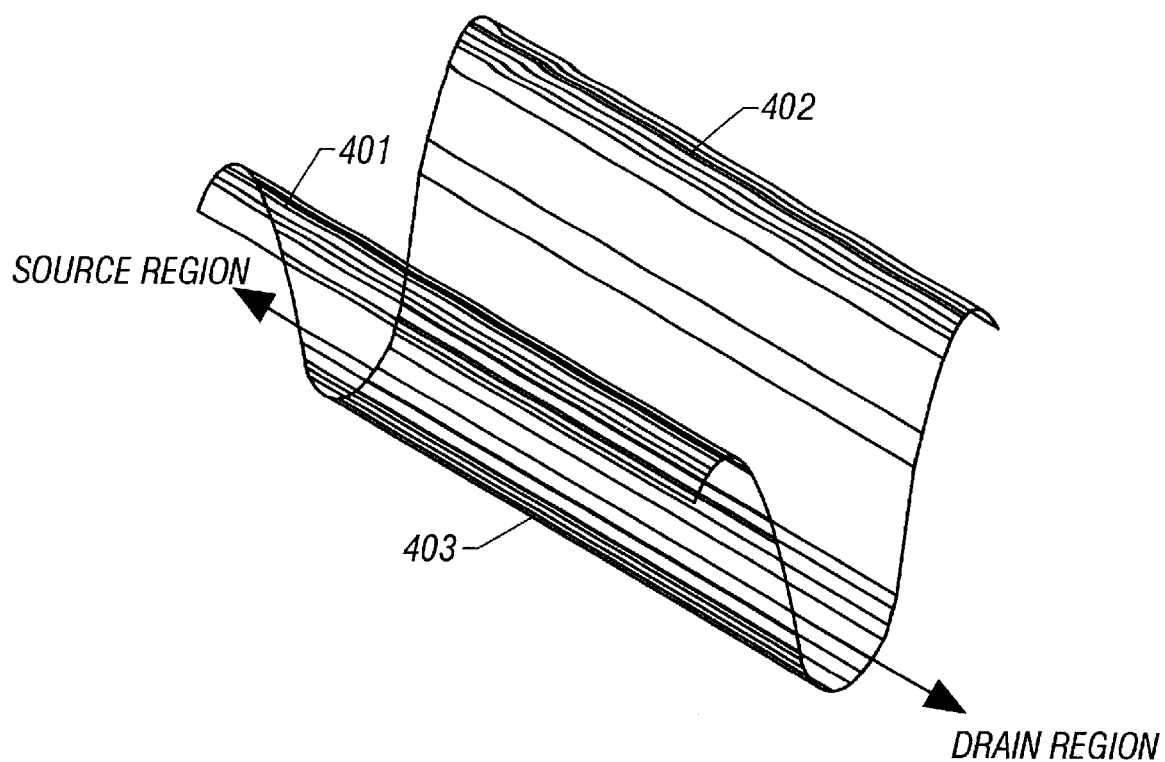
FIG. 4 is a view showing the energy state of an activation region.

FIG. 4 shows an energy state (potential state) of the activation region 102 when the pinning TFT according to the embodiment is operated. In FIG. 4, regions designated by numerals 401 and 402 correspond to the energy state of the $Si_xGe_{1-x}$ region 105 and a region designated by numeral 403 correspond to the energy state of the Si region 106.

As is apparent from FIG. 4, the $Si_xGe_{1-x}$ region 105 is present between the Si regions 106 contiguous to each other and constitutes a high barrier for electron in view of energy. Therefore, electron cannot ride over the $Si_xGe_{1-x}$ region 105 and moves preferentially in the Si regions 106 having a low energy state.

In this way, the $Si_xGe_{1-x}$ 105 is formed with the high barrier for electron in view of energy and the threshold value voltage at the portion is increased. As a result, the threshold value voltage observed as a whole is also increased. The narrower the width of the Si region 106, the more significantly the narrow channel effect emerges.

In controlling such a threshold voltage, a desired value can be aimed at by varying the composition of the $Si_xGe_{1-x}$ region 105 (which relates to band gap or band structure). Further, the threshold voltage can be controlled to a desired value by pertinently setting the width (vj) of the Si region.

As mentioned above, according to the present invention, the intensity of the narrow channel effect can be controlled and the threshold value voltage can be adjusted by pertinently designing the $Si_xGe_{1-x}$ region 105. That is, the threshold voltage can be adjusted to a desired value by balancing a decrease in the threshold value voltage caused by the short channel effect with an increase in the threshold value voltage caused by the narrow channel effect by controlling the pinning effect.

Next, an explanation will be given of a third effect. According to the present invention, both of the $Si_xGe_{1-x}$ 105 and the Si region 106 are substantially intrinsic regions. That is, in an N-channel type pinning FET, the Si region 106 constituting the channel forming region is constituted by an intrinsic or a substantially intrinsic region and majority carrier is moved in the region.

Here, the intrinsic region is referred to as a region which is not intentionally added with an impurity element providing an N-type or a P-type as well as impurity elements of carbon, nitrogen and oxygen. Further, the substantially intrinsic region is referred to as a region where a conductive type thereof is intentionally canceled by adding an impurity having an inverse conductive type or a region having one conductive type within a range where the threshold value voltage can be controlled.

For example, a silicon substrate having a dopant concentration (concentration of phosphor, arsenic, boron, indium, antimony and the like) of $5\times10^{17}$ atoms/cm$^3$ or less (preferably, $5\times10^{15}$ atoms/cm$^3$ or less) and a concentration of carbon, nitrogen and oxygen which are included of $2\times10^{18}$ atoms/cm$^3$ or less, may be regarded as substantially intrinsic.

In view of the meaning, all of single crystal silicon substrates which are generally used for semiconductors may be regarded as substantially intrinsic so far as an impurity element providing one conductive type is not intentionally added in the processing procedure.

When a region where carrier is moved is intrinsic or substantially intrinsic, lowering of mobility caused by scattering impurity is extremely reduced and high mobility can be achieved. This point provides a significant difference between the present invention and the channel dope process.

Further, when the linear $Si_xGe_{1-x}$ regions 105 are provided from the source region 101 to the drain region 103 as shown by FIG. 1A, there is achieved an effect where paths for moving majority carrier are rectified.

As mentioned above, the energy state of the Si region 106 sandwiched by the $Si_xGe_{1-x}$ regions 105 constitutes the state shown by FIG. 4. According to the constitution shown by FIG. 1A, it seems that a plurality of slits under the energy state shown by FIG. 4 are arranged.

Figure 5:
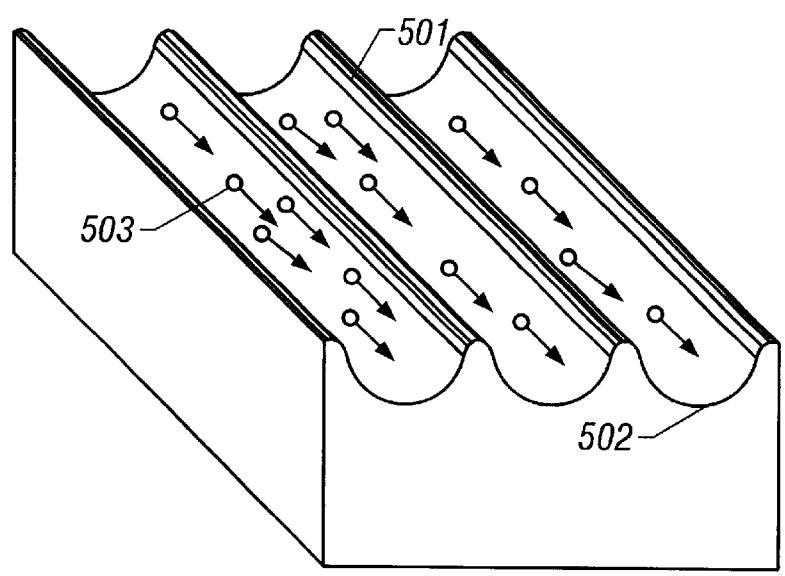
FIG. 5 is a view schematically showing the energy state of an activation region.

This behavior is schematically expressed by FIG. 5. In FIG. 5, numeral 501 designates the $Si_xGe_{1-x}$ region (pinning region) and numeral 502 designates the Si region (channel forming region). Further, numeral 503 designates majority carrier (electron in this case). As shown by FIG. 5, the electron 503 cannot ride over the $Si_xGe_{1-x}$ region 501 and accordingly, it is moved preferentially in the Si region 502.

By rectifying the paths for moving the majority carrier, scattering caused by self collision of the carriers is reduced. This significantly contributes to the promotion of the mobility.

Next, an explanation will be given of a fourth effect. Although it has already been described that the pinning region according to the present invention is provided with functions of preventing the short channel effect and controlling the threshold value voltage, otherwise, the pinning region achieves a very important role in preventing lowering of the withstand voltage between the source and the drain caused by impact ionization.

Minority carrier (hole in this case) formed by impact ionization (impact ionization phenomenon) causes a yield phenomenon of a carrier injection induced type such as bringing a parasitic bipolar transistor into a conductive state or lowering the diffusion potential on the side of the source accumulated at a vicinity of the source.

However, in the case of an N-channel type pinning FET having a structure shown by FIG. 1, the $Si_xGe_{1-x}$ region 105 behaves as a potential groove for hole and hole generated by impact ionization flows in the $Si_xGe_{1-x}$ region 105 and reaches the source region 101 as it is. Hence, by drawing out hole by connecting the $Si_xGe_{1-x}$ region 105 with an outer terminal, accumulation of hole can be prevented.

In this way, the pinning region according to the present invention functions as a path for flowing minority carrier (hole) generated by impact ionization in a direction reverse to the direction of majority carrier (electron) and drawing out the minority carrier to outside as it is.

The yield phenomenon of carrier injection induced type caused by impact ionization can be prevented by the fourth effect and therefore, a semiconductor device having very high withstand voltage and having high reliability can be realized by synergic effect in respect with the first effect (prevention of lowering of withstand voltage caused by punch through).

By the effects mentioned above, the pinning TFT according to the present invention can simultaneously achieve the high reliability and the high mobility.

Although according to the above-described explanation, the explanation has been given with an N-channel type FET as an example, a similar effect can be achieved even with a P-channel type FET. However, although the $Si_xGe_{1-x}$ region 105 functions as a pinning region and the Si region 106 functions as a channel forming region, according to the P-channel type FET, the $Si_xGe_{1-x}$ region 105 functions as the channel forming region and the Si region 106 functions as the pinning region that is a difference therebetween.

(Embodiment 2)

In Embodiment 1, an explanation has been given of an example in the case where the present invention is applied to MOSFET utilizing a bulk single crystal. Otherwise, the present invention is applicable to a thin film transistor (TFT) utilizing a crystalline semiconductor thin film.

As a crystalline semiconductor thin film, a single crystal semiconductor thin film, a polycrystal semiconductor thin film or the like can be used. A single crystal semiconductor thin film can be provided by utilizing publicly-known technologies such as a process by oxygen ion implantation (SIMOX), a process by pasting together, an ELTRAN process, a smart cut process and so on.

Further, a polycrystal semiconductor thin film can be provided by utilizing a technology described in Japanese Unexamined Patent Publication No. JP-A-7-130652, a process of crystallizing an amorphous semiconductor thin film by utilizing a technology using laser annealing or the like, a process of directly forming a film by a low pressure thermal CVD (Chemical Vapor Deposition) process and the like.

Particularly, when the technology described in Japanese Unexamined Patent Publication No. JP-A-7-130652, a semiconductor thin film excellent in crystalline performance can preferably be provided by also using a technology of getting a catalyst element promoting crystallization by a halogen element (Japanese Patent Application No. 8-335152 or the like) or a technology of getting a catalyst element by a phosphorus element (Japanese Patent Application No. 9-29551 or the like).

Further, other than these, a crystalline semiconductor thin film formed by all of the means can be used. Here, the constitution in the case where the present invention is applied to TFT will be explained in reference to FIGS. 6A, 6B and 6C.

In FIGS. 6A, 6B and 6C, numeral 601 designates a source region, numeral 602 designates a drain region, numeral 603 designates an activation region, numeral 604 designates a $Si_xGe_{1-x}$ region, numeral 605 designates a Si region and numeral 606 designates an LDD region. These are formed by utilizing a crystalline semiconductor thin film.

Further, numeral 607 designates a gate electrode whose major component is aluminum, numeral 608 designates an anodized film provided by anodically oxidizing the gate electrode, numeral 609 designates a source electrode and numeral 610 designates a drain electrode. Further, a gate electrode 607 may use tantalum, tungsten, molybdenum or silicon provided with a conductivity.

Next, FIG. 6B shows a sectional view taken along a line A–A' of FIG. 6A. In FIG. 6B, numeral 611 designates a substrate having an insulating surface and numeral 612 designates a matrix film on which a crystalline semiconductor thin film is formed. A substrate having heat resistance capable of withstanding a maximum temperature of a process is used for the substrate 611. Further, numeral 613 designates a gate insulating film and an interlayer insulating film 614 is provided on the gate electrode 607 and the anodized film 608 on the gate insulating film.

Next, FIG. 6C shows a sectional view taken along a line B–B' of FIG. 6A. Although as shown by FIG. 6C, TFT of the present invention is similar to TFT utilizing the technology described in Japanese Unexamined Patent Publication No. JP-A-7-135318 in respect of the basic structure, it is different therefrom in that the $Si_xGe_{1-x}$ region 604 is provided to the activation region 603.

In this way, the present invention is an engineering with respect to the activation region (right below gate electrode) and is not a technology influenced by other TFT structure. That is, the present invention is not limited to the TFT structure illustrated by FIGS. 6A, 6B and 6C but is applicable to all of structures of TFTs.

(Embodiment 3)

The pinning FET shown by Embodiment 1 or the pinning TFT shown by Embodiment 2 can easily constitute a CMOS circuit (inverter circuit) by complimentarily combining an N-channel type and a P-channel type.

According to a semiconductor device to which the present invention is applied, an Si region functions as a channel forming region in the case of an N-channel type and a $Si_xGe_{1-x}$ region functions as a channel forming region in the case of a P-channel type. Accordingly, physical properties of a region where majority carrier moves differ depending on an N-channel type or a P-channel type.

Further, in recent times, there has been a report stating that a higher mobility is achieved in the case of TFT where a channel forming region is constituted by $Si_xGe_{1-x}$ compared with FET where the channel forming region is constituted by Si. Accordingly, a P-channel type where a $Si_xGe_{1-x}$ region functions as a channel forming region, is anticipated to be effective in promoting the mobility. This is very significant in constituting a CMOS circuit.

Normally, it has been pointed out that the mobility of a P-channel type is smaller than that of an N-channel type and the difference in property constitutes one of factors which give rise to operational failure of a CMOS circuit. However, when a CMOS circuit is constituted by using a semiconductor device according to the present invention, particularly, the mobility of a P-channel type semiconductor device is promoted and therefore, the difference in property is reduced as a result. Accordingly, a CMOS circuit having very stable operation can be constituted.

(Embodiment 4)

The embodiment describes an example in the case where an impurity element for making high an energy barrier is added to a region which functions as a pinning region in semiconductor devices shown by Embodiment 1 through Embodiment 3.

Specifically, boron or indium is added to a $Si_xGe_{1-x}$ region in the case of an N-channel type semiconductor device. Meanwhile, in the case of a P-channel type semiconductor device, phosphorus, arsenic or antimony is added to a Si region.

In the case of an N-channel type semiconductor device, majority carrier is electron and therefore, elements of 13 group for shifting the band structure in a direction for hampering movement of electron. In this case, a function as a path for drawing out hole which is minority carrier is not deteriorated. Further, elements of 13 group shift the threshold value voltage in the positive direction. Conversely, in the case of a P-channel type semiconductor device, majority carrier is hole and therefore, elements of 15 group for shifting the band structure in a direction of hampering movement of hole are used. In this case, elements of 15 group shift the threshold value voltage in the negative direction.

By constituting such a structure, a region of moving majority carrier (channel forming region) and a region for moving minority carrier (pinning region) are clearly differentiated from each other. Further, the threshold value voltage can be controlled also by an impurity element added to the pinning region. Further, the impurity element may be added by an ion implantation process.

Further, in this case, it is further effective to simultaneously add oxygen to the region added with elements of 13 group or 15 group. By adding oxygen, withstand voltage at a junction portion with respect to the drain region is promoted. Further, oxygen may be added by an ion implantation process while utilizing a mask used in adding elements of 13 group or 15 group is used as it is.

(Embodiment 5)

In the semiconductor devices shown by Embodiment 1 through Embodiment 3, widths of the $Si_xGe_{1-x}$ region and the Si region may be made different from each other in accordance with an N-channel type and a P-channel type. Because, for example, the $Si_xGe_{1-x}$ region plays roles contrary to each other depending on a difference in a conductive type of a semiconductor device to which it is applied such that it functions as the pinning region in an N-channel type semiconductor device and functions as a channel forming region in a P-channel type semiconductor device.

For example, a devise where the channel forming region is made as wide as possible and the pinning region is made as narrow as possible, is needed in the case where large current needs to handle as in an amplifier group circuit or the like. Accordingly, the constitution in that case differs depending on an N-channel type and a P-channel type.

Figure 7:
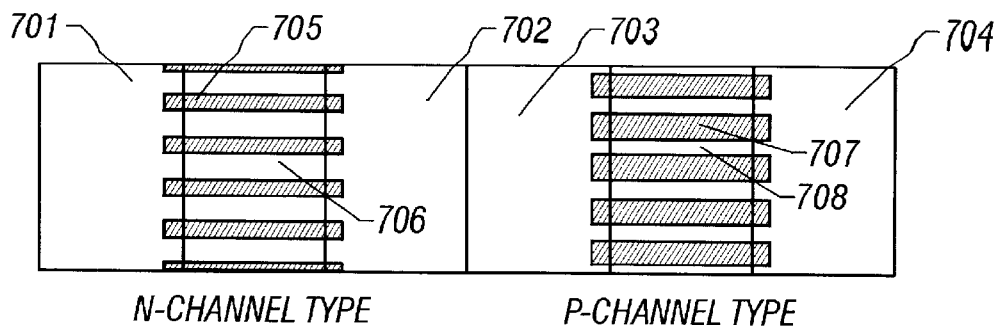
FIG. 7 is a view showing the constitution of an activation region.

FIG. 7 shows an example of a CMOS circuit having a constitution suitable for a circuit which needs to flow large current. Incidentally, an explanation will be given by paying attention to only the constitution of source/drain regions and an activation region to simplify the drawing. Numerals 701 and 702 designates respectively a source region and a drain region of an N-channel type semiconductor device. Numeral 703 and 704 respectively designate a source region and a drain region of a P-channel type semiconductor device.

In the case of the N-channel type semiconductor device, $Si_xGe_{1-x}$ regions 705 and Si regions 706 are formed in the activation region. In this case, electron moves in the Si regions 706 and accordingly, large current is made easy to flow by widening the Si regions 706. The width of the Si region 706 may be adjusted to the range described in Embodiment 1.

Meanwhile, $Si_xGe_{1-x}$ regions 707 and Si regions 708 are formed in the activation region in the case of P-channel type semiconductor device. In this case, hole moves in the $Si_xGe_{1-x}$ regions 707 and accordingly, the $Si_xGe_{1-x}$ regions 707 are formed widely. The width may be adjusted in the range described in Embodiment 1.

Further, in the case where the pinning effect is intended to intensify, it is preferable to widen the $Si_xGe_{1-x}$ region in the N-channel type semiconductor device and widen the Si region in the P-channel type semiconductor device.

As described above, an element having a desired property can be formed by changing the width of the pinning region in accordance with necessary function. Further, it is important to carry out necessary design in sufficient consideration of the fact that regions where majority carrier moves differ depending on an N-channel type and a P-channel type.

(Embodiment 6)

In this embodiment, an explanation will be given of a constitution for effectively utilizing the fourth effect explained in Embodiment 1. Further, the explanation will be given in reference to FIG. 8 and the explanation will be given with an N-channel type semiconductor device as an example.

Figure 8:
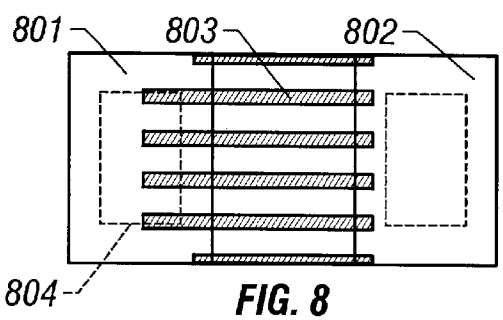
FIG. 8 is a view showing the constitution of an activation region.

In FIG. 8, numeral 801 designates a source region, numeral 802 designates a drain region and numeral 803 designates a $Si_xGe_{1-x}$ region (pinning region). Further, numeral 804 designates a connecting portion (contact hole) where a source electrode which is not illustrated is connected with the source region 801.

The fourth effect, that is, the effect of preventing minority carrier (hole) generated by impact ionization from being accumulated, is achieved by having generated hole escape to the source region via the $Si_xGe_{1-x}$ regions 803.

For that purpose, as illustrated by FIG. 8 when the $Si_xGe_{1-x}$ regions 803 are formed sufficiently long to reach inside of the connecting portion 804, a source electrode (not illustrated) is brought into direct contact with the $Si_xGe_{1-x}$ regions 803. Thereby, hole which has moved to the source region 801 via the $Si_xGe_{1-x}$ regions 803, is led to outside by the source electrode.

The effect of the embodiment is obtained similarly in a P-channel type semiconductor device. Further, it is effective to apply the effect not only to a single element of FET, TFT or the like but to a CMOS circuit or the like.

However, the phenomenon of deterioration caused by impact ionization is difficult to pose a problem inherently in the case of a P-channel type semiconductor device and therefore, the constitution of the embodiment may be applied only to an N-channel type semiconductor device.

(Embodiment 7)

In this embodiment, an explanation will be given of an example of an activation region having a constitution different from that of Embodiment 1. Further, an explanation will be given with an N-channel type as an example.

The most important effect of the present invention resides in that the depletion layer widening from the drain side toward the source is restrained. To achieve the effect, a pinning region for restraining the depletion layer may be provided somewhere in the activation region.

Figure 9A:
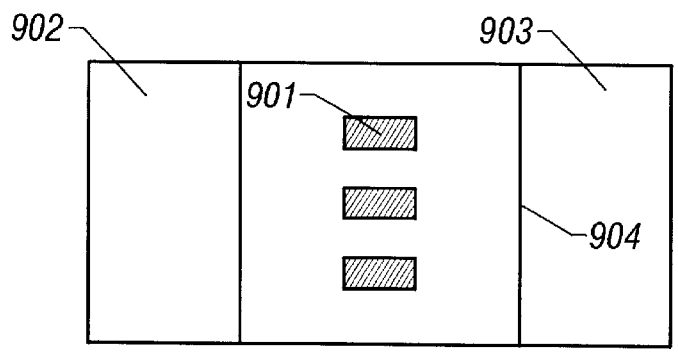
FIGS. 9A and 9B are views showing the constitution of an activation region.

A constitution shown by FIG. 9A is conceivable as such an example. According to the constitution of FIG. 9A, $Si_xGe_{1-x}$ regions 901 are formed such that they are not brought into contact with a source region 902 and a drain region 903.

In this case, the depletion layer widened from the drain side is cut at locations of the $Si_xGe_{1-x}$ regions 901. Further, the $Si_xGe_{1-x}$ regions 901 are not brought into contact with a junction portion 904 between the activation region and the drain region and accordingly, electric field concentration is not caused at the junction between the $Si_xGe_{1-x}$ regions and the drain region which is effective in promoting withstand voltage.

Figure 9B:
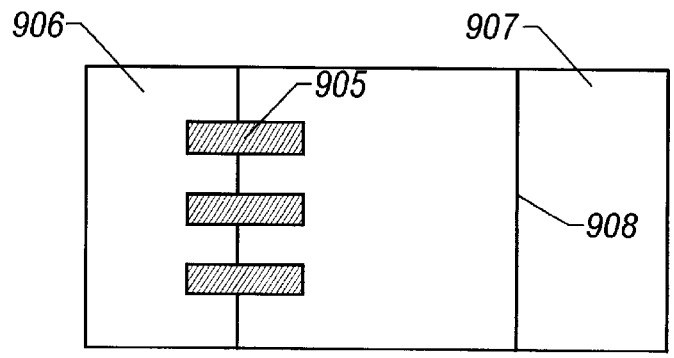

Further, a constitution shown by FIG. 9B is also conceivable. According to the constitution of FIG. 9B, $Si_xGe_{1-x}$ regions 905 enter the inside of the source region 906 and is not brought into contact with the drain region 907. Therefore, the electric field concentration is not caused at a drain junction portion 908 and withstand voltage is also promoted.

In this case, it is effective to pull out minority carrier caused by impact ionization to the source region 906. When this constitution is combined with the constitution of Embodiment 6, a further significant effect can be achieved.

Further, the constitution of the embodiment can achieve a similar effect also in a P-channel type semiconductor device. Also, the embodiment is applicable to all of the semiconductor devices shown in Embodiment 1 through Embodiment 3.

(Embodiment 8)

In constituting the CMOS circuit shown by Embodiment 3, the present invention is applicable also to one of them. For example, according to a constitution shown by FIG. 10A, a conventional FET using channel dope (channel dope FET) is used for an N-channel type FET and a pinning FET of the present invention is used for a P-channel type FET.

Figure 10A:
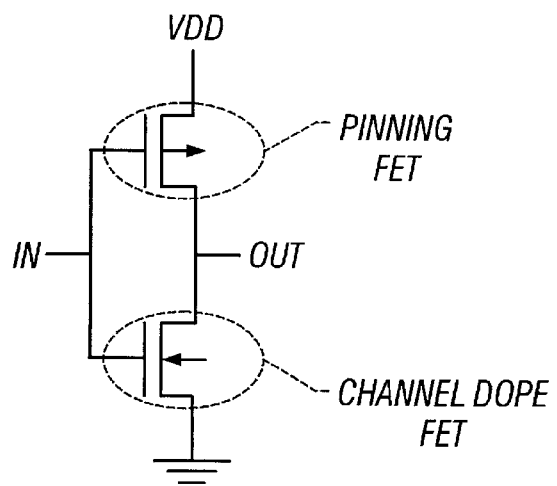
FIGS. 10A and 10B are views for explaining a CMOS (Complementary Metal Oxide Semiconductor) circuit.

According to the constitution shown by FIG. 10A, the conventional channel dope is used in the N-channel type FET and therefore, some degree of restriction is imposed on the mobility. Conversely, high mobility is realized in the P-channel type FET by pinning. Therefore, a difference between outputs of properties of the N-channel type and the P-channel type is alleviated and a CMOS circuit having stable operation is easy to constitute.

Figure 10B:
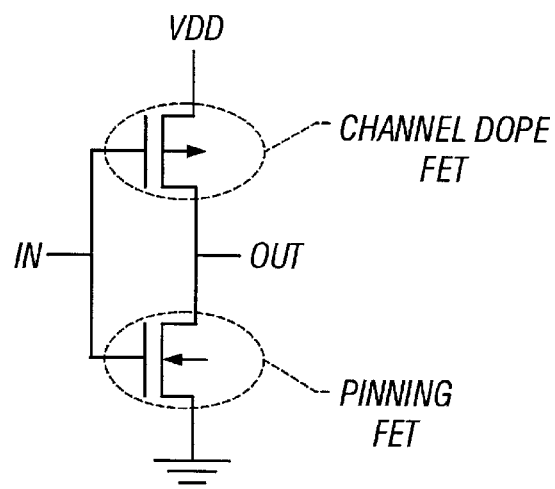

Naturally, a constitution shown by FIG. 10B may be adopted. According to the constitution of FIG. 10B, a pinning FET is used as an N-channel type FET and the conventional FET utilizing channel dope is used as a P-channel type FET.

Further, although according to the embodiment, an explanation has been given with FET as an example, the same naturally goes with the case where the present invention is applied to TFT.

As in the embodiment, a devise for mixing the pinning semiconductor device according to the present invention and the conventional semiconductor device utilizing channel dope at a pertinent location is needed for forming a further preferable circuit.

(Embodiment 9)

The present invention is applicable not only to a top gate type semiconductor device (representatively, planar type semiconductor device) but is applicable also to a bottom gate type semiconductor device (representatively, inverse stagger type semiconductor device).

Further, also in the case where the present invention is applied to a bottom gate type semiconductor device, combinations with constitutions of other embodiments are feasible.

(Embodiment 10)

In this embodiment, an explanation will be given of an example in the case where an electrooptical device is constituted by using a pinning TFT according to the present invention. Incidentally, an electrooptical device is defined as a device for converting electric signal into optical signal or a device for converting optical signal into electric signal.

As an electrooptical device, a liquid crystal display device of an active matrix type, an EL (Electroluminescence) display device, an EC (Electrochromic) display device or the like is pointed out. Further, an image sensor or a CCD (Charge Coupled Device) can be fabricated.

Figure 11:
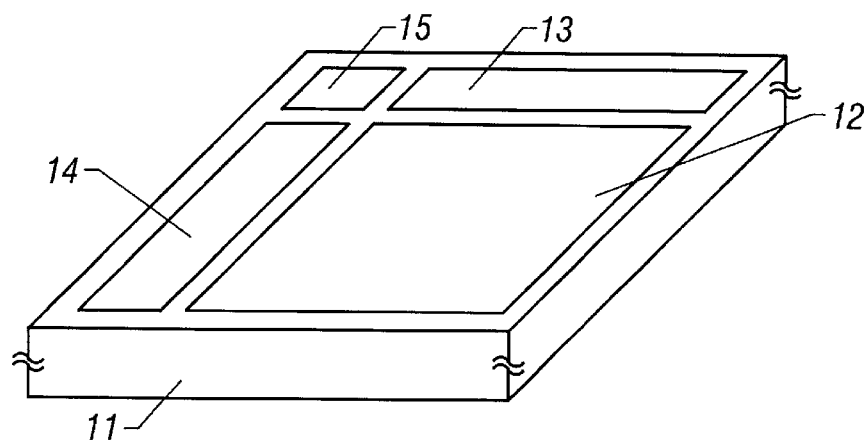
FIG. 11 is a view showing the outline constitution of an electrooptical device.

FIG. 11 shows an example of arranging a portion of a liquid crystal module (substrate on side of forming element). Numeral 11 designates a substrate having an insulating surface, numeral 12 designates a pixel matrix circuit, numeral 13 designates a source side drive circuit, numeral 14 designates a gate side drive circuit and numeral 15 designates a logic circuit.

The source side drive circuit 13 is constituted mainly by a shift register circuit, a sampling circuit, a buffer circuit and so on. Further, the gate side drive circuit 14 is constituted mainly by a shift register circuit, a buffer circuit and so on. The logic circuit 15 is constituted by various signal processing circuits such as a clock generating circuit, a memory circuit, an operation circuit, a signal converting circuit and so on.

The pinning TFT of the present invention is applicable to all of the circuits. Further, it can be adopted partially in accordance with necessary function. For example, it is effective to apply the pinning TFT to a circuit where high speed operational characteristic is needed (logic circuit, shift register circuit or the like). Further, it is effective to apply the pinning TFT to a pixel matrix circuit where high withstand characteristic is needed.

Meanwhile, the merit of utilizing the pinning TFT is not achieved in respect of the circuit where large current is needed as in a buffer circuit or a sampling circuit or the like. According to the pinning TFT of the present invention, the effective channel width is narrowed by an amount of forming the pinning region and therefore, ON current is difficult to gain in comparison with the conventional TFT having the same size.

Accordingly, a system where the conventional TFT using channel dope is used in a circuit where large current is necessary and the pinning TFT of the present invention is used in a circuit where large current is not handled and importance is attached to high speed operational performance and high withstand voltage performance, is preferable.

Further, although according to the embodiment, an example, constituting an electrooptical device by using the pinning TFT shown by Embodiment 2 has been described, the drive circuit or the logic circuit is integrated with the CMOS circuit shown by Embodiment 3 as a basic circuit. Further, the liquid crystal module of the embodiment can be constituted by using the pinning FET shown by Embodiment 1.

(Embodiment 11)

The pinning semiconductor device according to the present invention can construct not only the electrooptical device shown by Embodiment 10 but a semiconductor circuit such as a logic IC (Integrated Circuit) or a logic LSI (Large Scale Integrated Circuit). Further, a semiconductor circuit is defined as an electric circuit for controlling and converting electric signal by utilizing semiconductor properties.

Further, it is also effective to apply the pinning semiconductor device to a circuit utilizing high frequency, specifically, MMIC (Microwave Module IC) or the like as in an input and output signal controlling circuit of a portable telephone.

Naturally, it is preferable that a constitution where the conventional semiconductor device using channel dope is used at a portion where large current needs to handle as in Embodiment 10 and the pinning semiconductor device according to the present invention is used at a portion where high speed operational performance and high withstand performance are needed.

Further, the pinning semiconductor device according to the present invention is effective also in the case where a circuit as a countermeasure against static electricity is constituted by making full use of the characteristic where high withstand voltage and high speed operation are simultaneously realized.

As mentioned above, the pinning semiconductor device according to the present invention is a semiconductor device simultaneously satisfying high operational function and high withstand voltage characteristic (high reliability) and accordingly, it is applicable to all of semiconductor circuits.

(Embodiment 12)

Electrooptical devices or semiconductor circuits constituted by using the pinning semiconductor devices of the present invention, are utilized as constituent parts of various electronic instruments. Incidentally, an electronic instrument pointed out in the embodiment is defined as a product mounted with a semiconductor circuit or an electrooptical device.

As such electronic instruments, there are pointed out a video camera, a still camera, a projector, a head mount display, a car navigation system, a personal computer, a portable information terminal (mobile computer, portable telephone or the like) and so on. Examples of these are shown by FIGS. 12A, 12B, 12C, 12D, 12E and 12F.

Figure 12A:
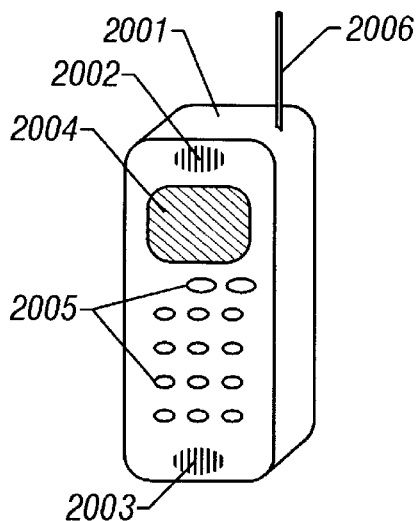
FIGS. 12A, 12B, 12C, 12D, 12E and 12F are views for explaining examples of electronic instruments.

FIG. 12A shows a portable telephone which is constituted by a main body 2001, a voice output unit 2002, a voice input unit 2003, a display device 2004, operation switches 2005 and an antenna 2006. The present invention is applicable to the voice output unit 2002, the voice input unit 2003, the display device 2004 and so on.

Figure 12B:
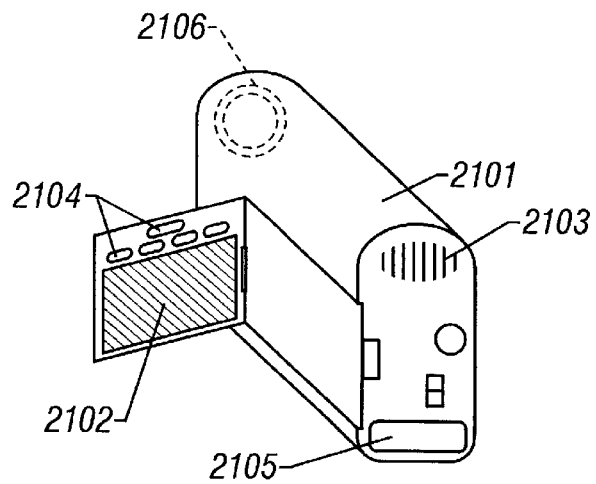

FIG. 12B shows a video camera which is constituted by a main body 2101, a display device 2102, a voice input unit 2103, operation switches 2104, a battery 2105 and an image receiving unit 2106. The present invention is applicable to the display device 2102, the voice input unit 2103, the image receiving unit 2106 and so on.

Figure 12C:
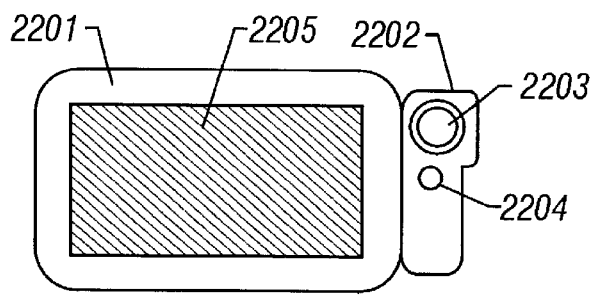

FIG. 12C shows a mobile computer which is constituted by a main body 2201, a camera unit 2202, an image receiving unit 2203, an operation switch 2204 and a display device 2205. The present invention is applicable to the camera unit 2202, the image receiving unit 2203, the display unit 2205 and so on.

Figure 12D:
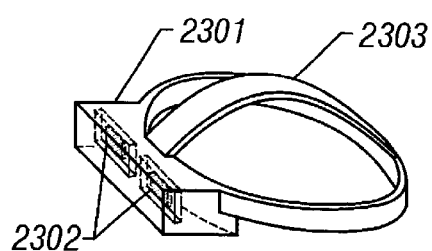

FIG. 12D shows a head mount display which is constituted by a main body 2301, a display device 2302 and a band unit 2303. The present invention is applicable to the display device 2302.

Figure 12E:
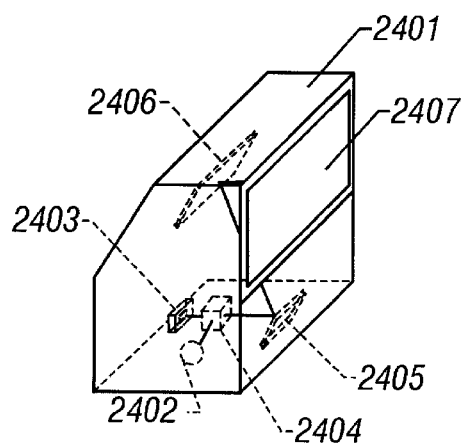

FIG. 12E shows a rear projection type projector which is constituted by a main body 2401, a light source 2402, a display device 2403, a polarized beam splitter 2404, reflectors 2405 and 2406 and a screen 2407. The present invention is applicable to the display device 2403.

Figure 12F:
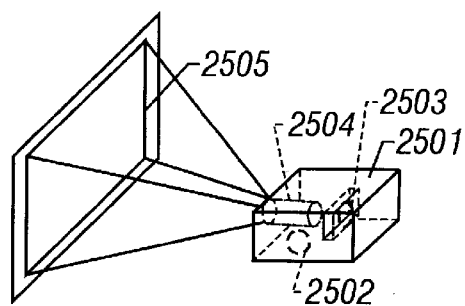

FIG. 12F is a front projection type projector which is constituted by a main body 2501, a light source 2502, a display device 2503, an optical system 2504 and a screen 2505. The present invention is applicable to the display device 2503.

As mentioned above, the range of applying the present invention is extremely wide and the present invention is applicable to electronic instruments of all the fields. Further, the present invention is applicable to all of products where the electrooptical device of Embodiment 10 and the semiconductor circuit of Embodiment 11 are needed.

Adverse influence caused by short channel effect can be restrained or prevented by the present invention even in a very small semiconductor device where the channel length and the channel width are extremely small. That is, lowering of the withstand voltage between source and drain caused by punch through and lowering of the threshold value voltage can be resolved simultaneously.

Further, the above-described effect can be achieved without including extraneous impurity in a channel forming region (region where carrier moves) and accordingly, the mobility of carrier is not deteriorated. As a result, there are provided advantages where very high mobility is realized and the invention is excellent in high speed operational performance (high frequency characteristic).

Further, by utilizing a pinning region formed in the channel forming region as a wiring for leading out minority carrier, lowering of the withstand voltage between source and drain caused by impact ionization can be prevented.

A semiconductor device simultaneously realizing high operational performance and high reliability can be realized by the synergic effect mentioned above. Further, very high function and high reliability can be achieved in an electrooptical device and a semiconductor circuit where the semiconductor device according to the present invention is adopted and an electronic instrument mounted therewith.

What is claimed is:

1. A semiconductor device comprising:
a source region, a drain region and an activation region in a crystalline semiconductor, wherein the activation region comprises $Si_xGe_{1-x}$ (0<x<1) regions and Si regions; and
a depletion layer widening from the drain region toward the source region is restrained by the $Si_xGe_{1-x}$ (0<x<1) regions,
wherein the $Si_xGe_{1-x}$ (0<x<1) regions and the Si regions are arranged along a width direction of said activation region and extend along a length direction of said activation region.

2. A semiconductor device comprising:
a source region, a drain region and an activation region in a crystalline semiconductor, wherein the activation region comprises $Si_xGe_{1-x}$ (0<x<1) regions and Si regions; and
a depletion layer widening from the drain region toward the source region is restrained by the Si regions,
wherein the $Si_xGe_{1-x}$ (0<x<1) regions and the Si regions are arranged along a width direction of said activation region and extend along a length direction of said activation region.

3. A semiconductor device comprising:
a source region, a drain region and an activation region in a crystalline semiconductor, wherein the activation region comprises $Si_xGe_{1-x}$ (0<x<1) regions provided and Si regions; and
a depletion layer widening from the drain region toward the source region is restrained and a threshold voltage is controlled by the $Si_xGe_{1-x}$ (0<x<1) regions,
wherein the $Si_xGe_{1-x}$ (0<x<1) regions and the Si regions are arranged along a width direction of said activation region and extend along a length direction of said activation region.

4. A semiconductor device comprising:
a source region, a drain region and an activation region in a crystalline semiconductor, wherein the activation region comprises $Si_xGe_{1-x}$ (0<x<1) regions and Si regions; and a depletion layer widening from the drain region toward the source region is restrained and a threshold voltage is controlled by the Si regions, wherein the $Si_xGe_{1-x}$ (0<x<1) regions and the Si regions are arranged along a width direction of said activation region and extend along a length direction of said activation region.

5. The semiconductor device according to claim 1, wherein the $Si_xGe_{1-x}$(0<x<1) regions are provided from the source region to the drain region.

6. The semiconductor device according to claim 2, wherein the $Si_xGe_{1-x}$(0<x<1) regions are provided from the source region to the drain region.

7. The semiconductor device according to claim 3, wherein the $Si_xGe_{1-x}$(0<x<1) regions are provided from the source region to the drain region.

8. The semiconductor device according to claim 4, wherein the $Si_xGe_{1-x}$(0<x<1) regions are provided from the source region to the drain region.

9. The semiconductor device according to claim 1, wherein the activation region comprises a region having a band gap of $Eg_1$ and a region having a band gap of $Eg_2$ which is smaller than $Eg_1$.

10. The semiconductor device according to claim 9, wherein the region having the band gap of $Eg_1$ is the Si region and the region having the band gap of $Eg_2$ is the $Si_xGe_{1-x}$ (0<x<1) region.

11. The semiconductor device according to claim 2, wherein the activation region comprises a region having a band gap of $Eg_1$ and a region having a band gap of $Eg_2$ which is smaller than $Eg_1$.

12. The semiconductor device according to claim 11, wherein the region having the band gap of $Eg_1$ is the Si region and the region having the band gap of $Eg_2$ is the $Si_xGe_{1-x}$ (0<x<1) region.

13. The semiconductor device according to claim 3, wherein the activation region comprises a region having a band gap of $Eg_1$ and a region having a band gap of $Eg_2$ which is smaller than $Eg_1$.

14. The semiconductor device according to claim 13, wherein the region having the band gap of $Eg_1$ is the Si region and the region having the band gap of $Eg_2$ is the $Si_xGe_{1-x}$ (0<x<1) region.

15. The semiconductor device according to claim 4, wherein the activation region comprises a region having a band gap of $Eg_1$ and a region having a band gap of $Eg_2$ which is smaller than $Eg_1$.

16. The semiconductor device according to claim 15, wherein the region having the band gap of $Eg_1$ is the Si region and the region having the band gap of $Eg_2$ is the $Si_xGe_{1-x}$ (0<x<1) region.

17. The semiconductor device according to claim 1, wherein a portion of the activation region constitutes a channel forming region.

18. The semiconductor device according to claim 2, wherein a portion of the activation region constitutes a channel forming region.

19. The semiconductor device according to claim 3, wherein a portion of the activation region constitutes a channel forming region.

20. The semiconductor device according to claim 4, wherein a portion of the activation region constitutes a channel forming region.

21. The semiconductor device according to claim 1, wherein the Si regions constitute paths for moving majority carriers and the $Si_xGe_{1-x}$ (0<x<1) regions constitute paths for moving to lead out minority carriers to outside of the activation region.

22. The semiconductor device according to claim 3, wherein the Si regions constitute paths for moving majority carriers and the $Si_xGe_{1-x}$ (0<x<1) regions constitute paths for moving to lead out minority carriers to outside of the activation region.

23. The semiconductor device according to claim 2, wherein the $Si_xGe_{1-x}$ (0<x<1) regions constitute paths for moving majority carriers and the Si regions constitute paths for moving to lead out minority carriers to outside of the activation region.

24. The semiconductor device according to claim 4, wherein the $Si_xGe_{1-x}$ (0<x<1) regions constitute paths for moving majority carriers and the Si regions constitute paths for moving to lead out minority carriers to outside of the activation region.

25. The semiconductor device according to claim 1, wherein a concentration of germanium in the $Si_xGe_{1-x}$ (0<x<1) regions is in a range that the notation x falls 0.05 through 0.95.

26. The semiconductor device according to claim 2, wherein a concentration of germanium in the $Si_xGe_{1-x}$ (0<x<1) regions is in a range that the notation x falls 0.05 through 0.95.

27. The semiconductor device according to claim 3, wherein a concentration of germanium in the $Si_xGe_{1-x}$ (0<x<1) regions is in a range that the notation x falls 0.05 through 0.95.

28. The semiconductor device according to claim 4, wherein a concentration of germanium in the $Si_xGe_{1-x}$ (0<x<1) regions is in a range that the notation x falls 0.05 through 0.95.

29. The semiconductor device according to claim 1, wherein the Si regions are intrinsic or substantially intrinsic.

30. The semiconductor device according to claim 3, wherein the Si regions are intrinsic or substantially intrinsic.

31. The semiconductor device according to claim 2, wherein the $Si_xGe_{1-x}$ (0<x<1) regions are intrinsic or substantially intrinsic.

32. The semiconductor device according to claim 4, wherein the $Si_xGe_{1-x}$ (0<x<1) regions are intrinsic or substantially intrinsic.

33. The semiconductor device according to claim 1, wherein said semiconductor device is an EL display device.

34. The semiconductor device according to claim 2, wherein said semiconductor device is an EL display device.

35. The semiconductor device according to claim 3, wherein said semiconductor device is an EL display device.

36. The semiconductor device according to claim 4, wherein said semiconductor device is an EL display device.

37. The semiconductor device according to claim 1, wherein said semiconductor device is one selected from the group consisting of a portable telephone, a video camera, a mobile computer, a head mount display, and a projector.

38. The semiconductor device according to claim 2, wherein said semiconductor device is one selected from the group consisting of a portable telephone, a video camera, a mobile computer, a head mount display, and a projector.

39. The semiconductor device according to claim 3, wherein said semiconductor device is one selected from the group consisting of a portable telephone, a video camera, a mobile computer, a head mount display, and a projector.

40. The semiconductor device according to claim 4, wherein said semiconductor device is one selected from the group consisting of a portable telephone, a video camera, a mobile computer, a head mount display, and a projector.

41. A semiconductor device comprising:
   a source region, a drain region and an activation region in a crystalline semiconductor, wherein said activation region and a portion of said source or drain region comprise $Si_xGe_{1-x}$ (0<x<1) regions and Si regions, and a depletion layer widening from the drain region toward the source region is restrained by the $Si_xGe_{1-x}$ (0<x<1) regions, wherein the $Si_xGe_{1-x}$ (0<x<1) regions and the Si regions are arranged along a width direction of said activation region and extend along a length direction of said activation region.

42. The semiconductor device according to claim 41, wherein the $Si_xGe_{1-x}$(0<x<1) regions are provided from the source region to the drain region.

43. The semiconductor device according to claim 41, wherein the activation region comprises a region having a band gap of $Eg_1$ and a region having a band gap of $Eg_2$ which is smaller than $Eg_1$.

44. The semiconductor device according to claim 43, wherein the region having the band gap of $Eg_1$ is the Si region and the region having the band gap of $Eg_2$ is the $Si_xGe_{1-x}$(0<x<1) region.

45. The semiconductor device according to claim 41, wherein a portion of the activation region constitutes a channel forming region.

46. The semiconductor device according to claim 41, wherein the Si regions constitute paths for moving majority carriers and the $Si_xGe_{1-x}$(0<x<1) regions constitute paths for moving to lead out minority carriers to outside of the activation region.

47. The semiconductor device according to claim 41, wherein a concentration of germanium in the $Si_xGe_{1-x}$ (0<x<1) regions is in a range that the notation x falls 0.05 through 0.95.

48. The semiconductor device according to claim 41, wherein the Si regions are intrinsic or substantially intrinsic.

49. The semiconductor device according to claim 41, wherein said semiconductor device is an EL display device.

50. The semiconductor device according to claim 41, wherein said semiconductor device is one selected from the group consisting of a portable telephone, a video camera, a mobile computer, a head mount display, and a projector.

51. A semiconductor device comprising:
a source region, a drain region and an activation region in a crystalline semiconductor, wherein said activation region and a portion of said source or drain region comprise $Si_xGe_{1-x}$ (0<x<1) regions and Si regions, and
a depletion layer widening from the drain region toward the source region is restrained by the Si regions,
wherein the $Si_xGe_{1-x}$ (0<x<1) regions and the Si regions are arranged along a width direction of said activation region and extend along a length direction of said activation region.

52. The semiconductor device according to claim 51, wherein the $Si_xGe_{1-x}$(0<x<1) regions are provided from the source region to the drain region.

53. The semiconductor device according to claim 51, wherein the activation region comprises a region having a band gap of $Eg_1$ and a region having a band gap of $Eg_2$ which is smaller than $Eg_1$.

54. The semiconductor device according to claim 53, wherein the region having the band gap of $Eg_1$ is the Si region and the region having the band gap of $Eg_2$ is the $Si_xGe_{1-x}$(0<x<1) region.

55. The semiconductor device according to claim 51, wherein a portion of the activation region constitutes a channel forming region.

56. The semiconductor device according to claim 51, wherein the $Si_xGe_{1-x}$(0<x<1) regions constitute paths for moving majority carriers and the Si regions constitute paths for moving to lead out minority carriers to outside of the activation region.

57. The semiconductor device according to claim 51, wherein a concentration of germanium in the $Si_xGe_{1-x}$ (0<x<1) regions is in a range that the notation x falls 0.05 through 0.95.

58. The semiconductor device according to claim 51, wherein the $Si_xGe_{1-x}$(0<x<1) regions are intrinsic or substantially intrinsic.

59. The semiconductor device according to claim 51, wherein said semiconductor device is an EL display device.

60. The semiconductor device according to claim 51, wherein said semiconductor device is one selected from the group consisting of a portable telephone, a video camera, a mobile computer, a head mount display, and a projector.

61. A semiconductor device comprising:
a source region, a drain region and an activation region in a crystalline semiconductor, wherein the activation region comprises $Si_xGe_{1-x}$ (0<x<1) regions and Si regions, and
wherein the $Si_xGe_{1-x}$ (0<x<1) regions and the Si regions are arranged along a width direction of said activation region and extend along a length direction of said activation region.

62. The semiconductor device according to claim 61, wherein a depletion layer widening from the drain region toward the source region is restrained by the $Si_xGe_{1-x}$ (0<x<1) regions locally provided.

63. The semiconductor device according to claim 61, wherein a depletion layer widening from the drain region toward the source region is restrained by the Si regions locally provided.

64. The semiconductor device according to claim 61, wherein the activation region comprises a region having a band gap of $Eg_1$ and a region having a band gap of $Eg_2$ which is smaller than $Eg_1$.

65. The semiconductor device according to claim 61, wherein a portion of the activation region constitutes a channel forming region.

66. The semiconductor device according to claim 61, wherein a concentration of germanium in the $Si_xGe_{1-x}$ (0<x<1) regions is in a range that the notation x falls 0.05 through 0.95.

67. The semiconductor device according to claim 61, wherein said semiconductor device is an EL display device.

68. The semiconductor device according to claim 61, wherein said semiconductor device is one selected from the group consisting of a portable telephone, a video camera, a mobile computer, a head mount display, and a projector.

69. A semiconductor device comprising:
a substrate having an insulating surface;
a semiconductor film comprising silicon provided over said substrate;
a source region, a drain region, and an activation region formed in said semiconductor film; and
a plurality of germanium doped regions formed in said semiconductor film between said source and said drain region,
wherein said plurality of germanium doped regions are arranged along a width direction of said activation region and extend along a length direction of said activation region.

70. The semiconductor device according to claim 69, wherein a portion of said activation region constitutes a channel forming region.

71. The semiconductor device according to claim 69, wherein said semiconductor device is an EL display device.

72. The semiconductor device according to claim 69, wherein said semiconductor device is one selected from the group consisting of a portable telephone, a video camera, a mobile computer, a head mount display, and a projector.

73. A semiconductor device comprising:
- a single crystal semiconductor comprising silicon;
- a source region, a drain region, and an activation region formed in said single crystal semiconductor;
- a plurality of germanium doped regions formed in said single crystal semiconductor between said source and said drain regions,
- wherein said plurality of germanium doped regions are arranged along a width direction of said activation region and extend along a length direction of said activation region.

74. The semiconductor device according to claim 73, wherein a portion of said activation region constitutes a channel forming region.

75. The semiconductor device according to claim 73, wherein said semiconductor device is a logic IC, or a logic LSI.

* * * * *